(12) United States Patent
Zha et al.

(10) Patent No.: US 11,775,122 B2
(45) Date of Patent: Oct. 3, 2023

(54) SENSOR MODULE AND DISPLAY DEVICE (71) Applicant: SHENZHEN CHINA STAR OPTOELECTRONICS SEMICONDUCTOR DISPLAY TECHNOLOGY CO., LTD., Shenzhen (CN)

(72) Inventors: Bao Zha, Shenzhen (CN); Miao Jiang, Shenzhen (CN); Jiangbo Yao, Shenzhen (CN); Lixuan Chen, Shenzhen (CN); Xin Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 393 days.

(21) Appl. No.: 17/057,612

(22) PCT Filed: Oct. 29, 2020

(86) PCT No.: PCT/CN2020/124625
§ 371 (c)(1),
(2) Date: Nov. 20, 2020

(87) PCT Pub. No.: WO2022/047963
PCT Pub. Date: Mar. 10, 2022

(65) Prior Publication Data
US 2022/0308699 A1  Sep. 29, 2022

(30) Foreign Application Priority Data
Sep. 3, 2020 (CN) .......................... 202010914028.1

(51) Int. Cl.
*G06F 3/044* (2006.01)
*G02F 1/1333* (2006.01)
*H01L 27/146* (2006.01)

(52) U.S. Cl.
CPC ........ *G06F 3/0445* (2019.05); *G02F 1/13338* (2013.01); *G06F 3/0446* (2019.05);
(Continued)

(58) Field of Classification Search
CPC ......... G02F 1/134309; G02F 1/133345; G02F 1/13338; G02F 1/1339; G02F 1/136209;
(Continued)

(56) References Cited

U.S. PATENT DOCUMENTS

| | | | | |
|---|---|---|---|---|
| 2007/0146580 A1* | 6/2007 | Ishitani | ............... | G02B 5/3025 349/96 |
| 2012/0154308 A1* | 6/2012 | Jeon | ..................... | G06F 3/0412 345/94 |

(Continued)

FOREIGN PATENT DOCUMENTS

| CN | 102955627 A | 3/2013 |
|---|---|---|
| CN | 103677413 A | 3/2014 |

(Continued)

OTHER PUBLICATIONS

International Search Report in International application No. PCT/CN2020/124625, dated May 27, 2021.
(Continued)

*Primary Examiner* — MD Saiful A Siddiqui
(74) *Attorney, Agent, or Firm* — PV IP PC; Wei Te Chung; Zhigang Ma (57) ABSTRACT

A sensor module and a display device are provided. The sensor module includes a substrate and a touch sensor positioned on the substrate. The touch sensor includes a transmitter electrode and a receiver electrode, positioned at (Continued)

one side of the transmitter electrode, which is back on to the substrate. An optical sensor includes a thin film transistor. A gate of the thin film transistor and the transmitter electrode are positioned in a same layer, and a source/drain of the thin film transistor and the receiver electrode are positioned in a same layer.

12 Claims, 4 Drawing Sheets

(52) U.S. Cl.
CPC .. *H01L 27/14623* (2013.01); *H01L 27/14643* (2013.01); *G06F 2203/04106* (2013.01)

(58) Field of Classification Search
CPC ............. G02F 1/1368; G02F 1/133514; G02F 2202/103; G02F 2202/28; G02F 2201/58; G06F 3/0412; G06F 3/0418; G06F 3/0421; G06F 3/044; G06F 2203/04103; G06F 2203/04106; H10K 59/40; H10K 59/60; H01L 27/323; H01L 27/3227
See application file for complete search history.

(56) References Cited

U.S. PATENT DOCUMENTS

| | | | | |
|---|---|---|---|---|
| 2014/0320769 A1* | 10/2014 | Masuda | ................ | G06F 3/0445 349/12 |
| 2015/0062088 A1 | 3/2015 | Cho | | |
| 2015/0362773 A1 | 12/2015 | Mu et al. | | |
| 2018/0203537 A1* | 7/2018 | Kim | ......................... | G06F 3/042 |
| 2020/0411608 A1* | 12/2020 | Tang | ..................... | H10K 59/353 |
| 2021/0233962 A1* | 7/2021 | Wang | ..................... | H10K 39/32 |

FOREIGN PATENT DOCUMENTS

| | | |
|---|---|---|
| CN | 104570449 A | 4/2015 |
| CN | 104699344 A | 6/2015 |
| CN | 106876386 A | 6/2017 |
| CN | 106970495 A | 7/2017 |
| CN | 110286796 A | 9/2019 |
| CN | 110413156 A | 11/2019 |
| CN | 111142714 A | 5/2020 |
| CN | 111399292 A | 7/2020 |
| CN | 111524917 A | 8/2020 |
| CN | 111696494 A | 9/2020 |

OTHER PUBLICATIONS

Written Opinion of the International Search Authority in International application No. PCT/CN2020/124625, dated May 27, 2021.
Chinese Office Action issued in corresponding Chinese Patent Application No. 202010914028.1 dated Jul. 29, 2021, pp. 1-9.

* cited by examiner

SENSOR MODULE AND DISPLAY DEVICE

RELATED APPLICATIONS

This application is a Notional Phase of PCT Patent Application No. PCT/CN2020/124625 having international filing date of Oct. 29, 2020, which claims the benefit of priority of Chinese Patent Application No. 202010914028.1 filed on Sep. 3, 2020. The contents of the above applications are all incorporated by reference as if fully set forth herein in their entirety.

FIELD OF THE INVENTION

The present invention relates to a display technology, and more particularly, to a sensor module and a display device.

BACKGROUND

As the progress of the display technology, it becomes a trend to integrate the sensors into the display panel. However, the conventional display has the sensors pasted on the outside of the display. This reduces the light efficiency of the display and increases the cost.

Furthermore, some LCDs have integrated sensors. However, no LCD could integrate both the touch sensor and the optical sensor. This means that the function of the LCD is single and thus it cannot meet the demand of touch control and light sensing control at the same time.

SUMMARY

Technical Problem

One objective of an embodiment of the present invention is to provide a sensor module and a display device to solve the above-mentioned issue, which cannot integrate both the touch sensor and the optical sensor.

Technical Solution

According to an embodiment of the present invention, a sensor module is disclosed. The sensor module includes a substrate and a touch sensor positioned on the substrate. The touch sensor includes a transmitter electrode and a receiver electrode, positioned at one side of the transmitter electrode, which is back on to the substrate. An optical sensor includes a thin film transistor. A gate of the thin film transistor and the transmitter electrode are positioned in a same layer, and a source/drain of the thin film transistor and the receiver electrode are positioned in a same layer.

Furthermore, the optical sensor further includes a plurality of scan lines and a plurality of data lines electrically connected to the TFT. The plurality of scan lines and the transmitter electrode are positioned in a same layer and the plurality of data lines and the receiver electrode are positioned in a same layer.

Furthermore, the transmitter electrode comprises a plurality of rows of first electrode units and any two adjacent first electrode units of the first electrode units along a row direction are electrically connected. The receiver electrode comprises a plurality of columns of second electrode units and any two adjacent second electrode units of the second electrode units along a column direction are electrically connected. An orthogonal projection of the plurality of rows of the first electrode units on the substrate crosses an orthogonal projection of the plurality of columns of the second electrode units on the substrate to form a mutual-capacitance electrode structure. A scan line is positioned between any two adjacent rows of the first electrode units and a data line is positioned between any two adjacent columns of the second electrode units.

Furthermore, the sensor module further comprises a plurality of intersection areas. An orthogonal projection of each of the scan lines on the substrate crosses an orthogonal project of each of the data lines on the substrate at one intersection area of the plurality of intersection areas. The TFT comprises a plurality of TFT structures corresponding to the plurality of intersection areas.

Furthermore, the TFT structure in each of plurality of intersection areas comprises a light sensing transistor and a switch transistor. A drain of the light sensing transistor is electrically connected to a corresponding data line, a gate of the switch transistor is electrically connected to a corresponding scan line, and a source of the light sensing transistor is electrically connected to a drain of the switch transistor.

Furthermore, each of the scan lines comprises two sub-scan lines corresponding to two rows of the first electrode units adjacent to the scan line, and each of the sub-scan line extends along a side of its corresponding row of the first electrode units. Each of the data lines comprises two sub-data lines corresponding to two columns of the second electrode units adjacent to the data line, and each of the sub-data line extends along a side of its corresponding column of the second electrode units.

Furthermore, the first electrode units and the second electrode units are all in a grid structure, and the shapes of grids in the grid structure include one or more of triangle, quadrilateral, hexagon, and octagon.

Furthermore, a dimension of the first electrode units and the second electrode units in a row direction is between 1 mm and 8 mm, and a dimension of the grids in the row direction is between 0.1 mm and 4 mm.

Furthermore, the sensor module further includes a black matrix, positioned at a side of the TFT structures, which is back on to the substrate. A position of the black matrix is corresponding to a position of the switch transistor of the TFT structures.

According to an embodiment of the present invention, a display device is disclosed. The display device comprises a display panel and a sensor module on the display panel. The sensor module includes a substrate and a touch sensor positioned on the substrate. The touch sensor includes a transmitter electrode and a receiver electrode, positioned at one side of the transmitter electrode, which is back on to the substrate. An optical sensor includes a thin film transistor. A gate of the thin film transistor and the transmitter electrode are positioned in a same layer, and a source/drain of the thin film transistor and the receiver electrode are positioned in a same layer.

Furthermore, the optical sensor further includes a plurality of scan lines and a plurality of data lines electrically connected to the TFT. The plurality of scan lines and the transmitter electrode are positioned in a same layer and the plurality of data lines and the receiver electrode are positioned in a same layer.

Furthermore, the transmitter electrode comprises a plurality of rows of first electrode units and any two adjacent first electrode units of the first electrode units along a row direction are electrically connected. The receiver electrode comprises a plurality of columns of second electrode units and any two adjacent second electrode units of the second electrode units along a column direction are electrically connected. An orthogonal projection of the plurality of rows of the first electrode units on the substrate crosses an orthogonal projection of the plurality of columns of the second electrode units on the substrate to form a mutual-capacitance electrode structure. A scan line is positioned between any two adjacent rows of the first electrode units and a data line is positioned between any two adjacent columns of the second electrode units.

Furthermore, the sensor module further comprises a plurality of intersection areas. An orthogonal projection of each of the scan lines on the substrate crosses an orthogonal project of each of the data lines on the substrate at one intersection area of the plurality of intersection areas. The TFT comprises a plurality of TFT structures corresponding to the plurality of intersection areas.

Furthermore, the TFT structure in each of plurality of intersection areas comprises a light sensing transistor and a switch transistor. A drain of the light sensing transistor is electrically connected to a corresponding data line, a gate of the switch transistor is electrically connected to a corresponding scan line, and a source of the light sensing transistor is electrically connected to a drain of the switch transistor.

Furthermore, each of the scan lines comprises two sub-scan lines corresponding to two rows of the first electrode units adjacent to the scan line, and each of the sub-scan line extends along a side of its corresponding row of the first electrode units. Each of the data lines comprises two sub-data lines corresponding to two columns of the second electrode units adjacent to the data line, and each of the sub-data line extends along a side of its corresponding column of the second electrode units.

Furthermore, the first electrode units and the second electrode units are all in a grid structure, and the shapes of grids in the grid structure include one or more of triangle, quadrilateral, hexagon, and octagon.

Furthermore, a dimension of the first electrode units and the second electrode units in a row direction is between 1 mm and 8 mm, and a dimension of the grids in the row direction is between 0.1 mm and 4 mm.

Furthermore, the sensor module further includes a black matrix, positioned at a side of the TFT structures, which is back on to the substrate. A position of the black matrix is corresponding to a position of the switch transistor of the TFT structures.

Advantageous Effects

In contrast to the conventional art, the present invention puts the touch sensor and optical sensor on the substrate. In addition, the present invention positions the transmitter electrode of the touch sensor and the gate of the TFT of the optical sensor in the same layer and positions the receiver electrode of the touch sensor and the source/drain of the TFT of the optical sensor in the same layer. Thus, the present invention could integrate both the touch sensor and the optical sensor and realize the short-distance touch control function and long-distance light sensing function of the display panel.

BRIEF DESCRIPTION OF THE DRAWINGS

These and other features, aspects and advantages of the present disclosure will become understood with reference to the following description, appended claims and accompanying figures.

DETAILED DESCRIPTION OF PREFERRED EMBODIMENTS

Embodiments of the present application are illustrated in detail in the accompanying drawings, in which like or similar reference numerals refer to like or similar elements or elements having the same or similar functions throughout the specification. The embodiments described below with reference to the accompanying drawings are exemplary and are intended to be illustrative of the present application, and are not to be construed as limiting the scope of the present application.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

Different methods or examples are introduced to elaborate different structures in the embodiments of the present disclosure. To simplify the method, only specific components and devices are elaborated by the present disclosure. These embodiments are truly exemplary instead of limiting the present disclosure. Identical numbers and/or letters for reference are used repeatedly in different examples for simplification and clearance. It does not imply that the relations between the methods and/or arrangement.

Specifically, the terminologies in the embodiments of the present invention are merely for describing the purpose of the certain embodiment, but not to limit the invention. Examples and the appended claims be implemented in the present invention requires the use of the singular form of the book "an", "the" and "the" are intended to include most forms unless the context clearly dictates otherwise. It should also be understood that the terminology used herein that "and/or" means and includes any or all possible combinations of one or more of the associated listed items.

In the following disclosure, the sensor module and the display device according to embodiments of the present invention will be illustrated in details.

Figure 1:
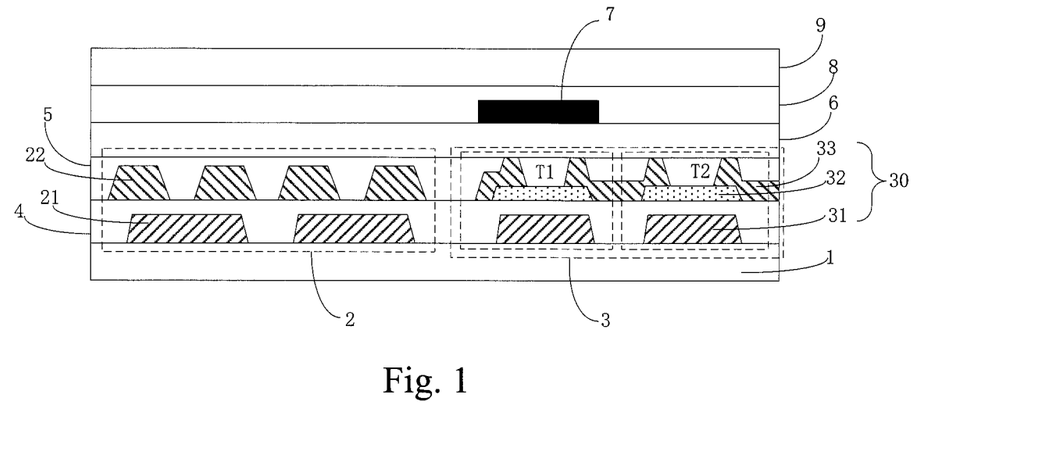
FIG. 1 is a diagram of a sensor module according to an embodiment of the present invention.

Please refer to FIG. 1. FIG. 1 is a diagram of a sensor module according to an embodiment of the present invention. As shown in FIG. 1, a sensor module is disclosed. The sensor module comprises a substrate 1, a touch sensor 2 and an optical sensor 3. The touch sensor 2 and the optical sensor 3 are on the substrate 1. The touch sensor 2 comprises a transmitter electrode 21 on the substrate 1. The optical sensor 3 comprises a thin film transistor (TFT) module 30 and a capacitor module (not shown). The gate 31 of the TFT 30 is on the substrate 11. That is, the transmitter electrode 21 of the touch sensor 2 and the gate 31 of the TFT 30 are positioned in the same layer. The sensor module further comprises a gate insulating layer 4 covering the transmitter electrode 21, the gate 31 and the substrate 1. The touch sensor 2 further comprises a receiver electrode 22 on the gate insulating layer 4. The TFT 30 further comprises an active layer 32 on the gate insulating layer 4 and the source/drain 33 on the active layer 32 and the gate insulating layer 4. That is, the receiver electrode 22 of the touch sensor 2 and the source/drain 33 of the TFT 30 are positioned in the same layer. In this way, the touch sensor 2 and the optical sensor 3 could be both integrated in the sensor module to achieve the short-distance touch control function and the long-distance light sensing function. In this embodiment, the material of the active layer 32 could be hydrogenated amorphous silicon (a-Si:H).

Figure 2:
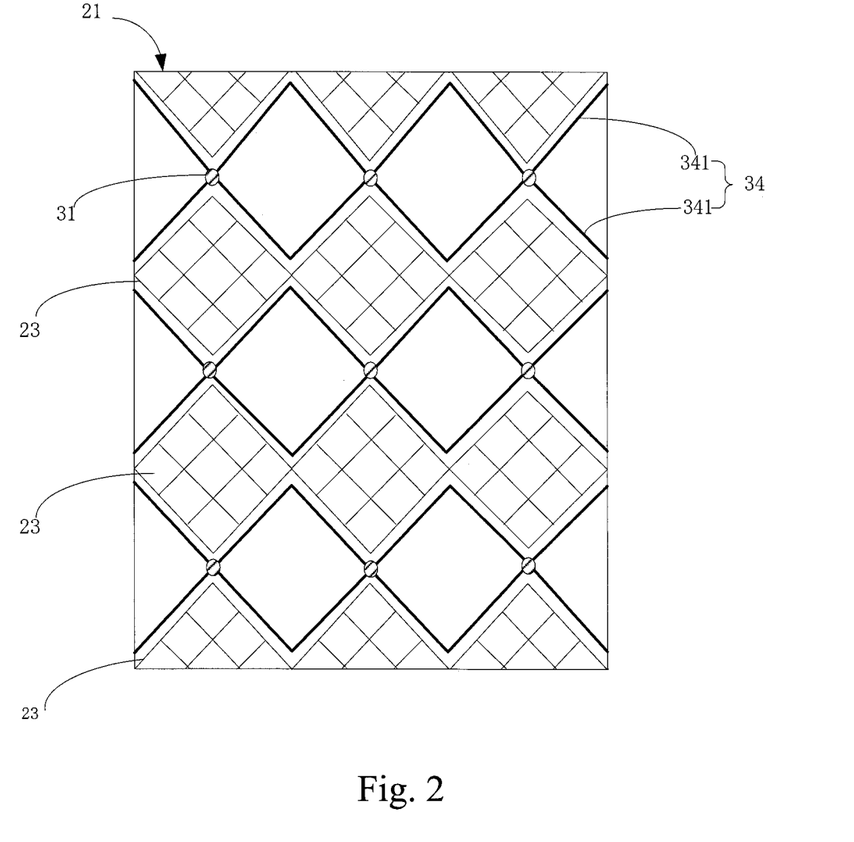
FIG. 2 is a diagram of a first metal layer in the sensor module according to an embodiment of the present invention.

The optical sensor 3 further comprises a plurality of scan lines 34 and a plurality of data lines 35 electrically connected to the TFT 30. The scan lines 34 and the data lines 35 are positioned in different film layers. The scan lines 34 are on the substrate 1. That is, as shown in FIG. 2, the scan lines 34, the transmitter electrode 21 of the touch sensor 2 and the gate 31 of the TFT 30 are positioned in the same layer to form the first metal layer. The data lines 35 are positioned on the gate insulating layer 4. That is, as shown in FIG. 3, the data lines 5, the receiver transmitter electrode 22 of the touch sensor 2, and the source/drain 33 of the TFT 30 are positioned in the same layer to form the second metal layer.

As shown in FIG. 2, the transmitter electrode 21 comprises a plurality of rows of first electrode units 23. Furthermore, any two adjacent first electrode units 23 along the row direction are electrically connected to each other. The scan lines 34 and the rows of the first electrode units 23 are positioned in turn. That is, a scan line 34 is positioned between any two adjacent rows of the first electrode units 23. Each scan line 34 extends along the row direction.

Figure 3:
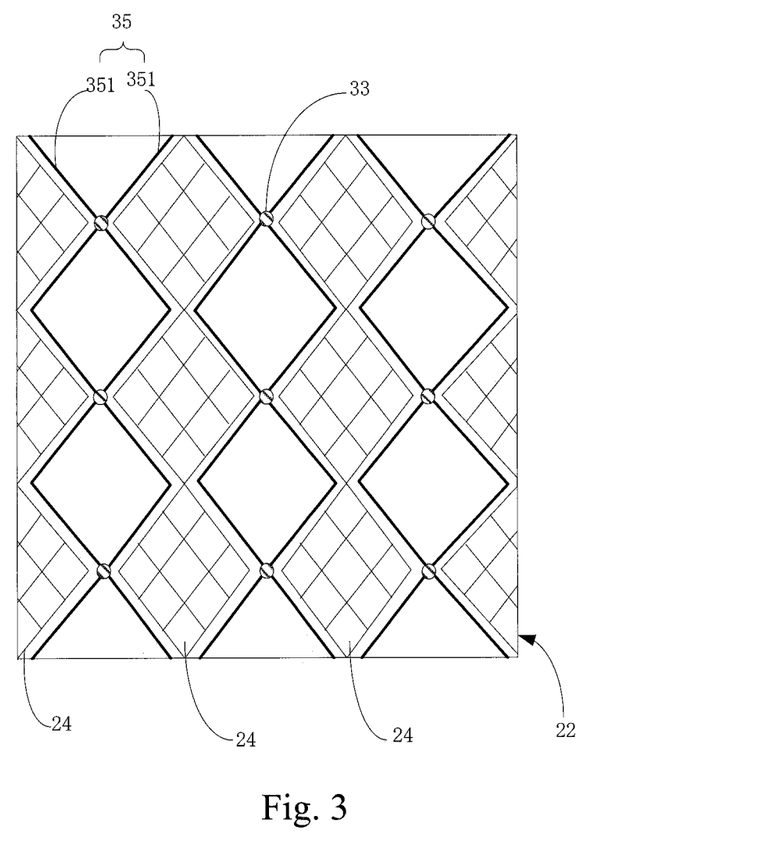
FIG. 3 is a diagram of a second metal layer in the sensor module according to an embodiment of the present invention.

As shown in FIG. 3, the receiver electrode 22 comprises a plurality of columns of second electrode units 24. Furthermore, any two adjacent second electrode units 24 along the column direction are electrically connected to each other. The data lines 35 and the columns of the second electrode units 24 are positioned in turn. That is, a data line 35 is positioned between any two adjacent columns of the second electrode units 24. Each data line 35 extends along the column direction.

The orthogonal projection of the plurality of rows of the first electrode units 23 on the substrate 1 crosses the orthogonal projection of the plurality of columns of the second electrode units 24 on the substrate 1 to form a mutual-capacitance electrode structure.

Figure 5:
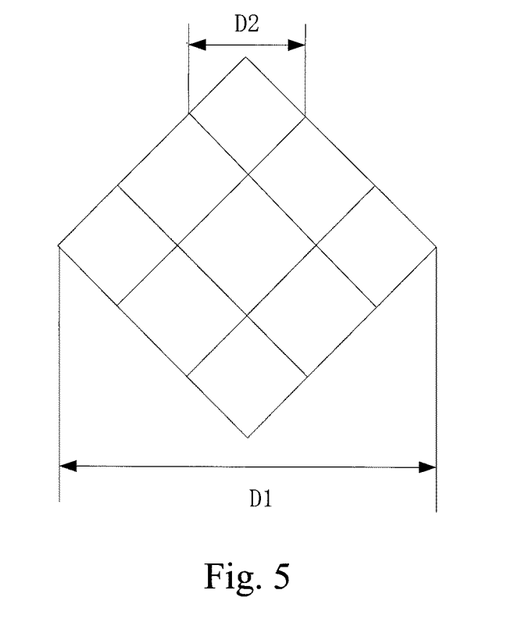
FIG. 5 is a diagram of a first electrode unit and a second electrode unit in the sensor module according to an embodiment of the present invention.

As shown in FIG. 5, the shape of the first electrode unit 23 and the second electrode unit 24 could be a diamond shape. Furthermore, the length D1 of the first electrode unit 23 and the second electrode unit 24 in the row direction is between 1 mm-8 mm. In addition, the first electrode units 23 and the second electrode units 24 are all in a grid structure, and the shapes of grids in the grid structure include one or more of triangle, quadrilateral, hexagon, and octagon. The length D2 of the grid 26 in the row direction is between 0.1 mm to 4 mm.

Figure 4:
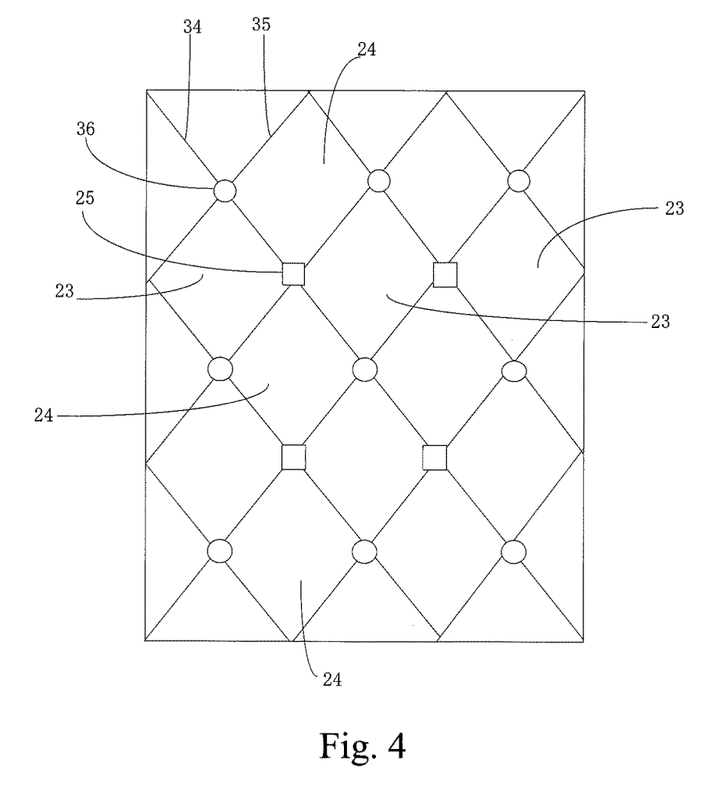
FIG. 4 is a simplified diagram showing the position relationship between the touch sensor and the optical sensor in the sensor module according to an embodiment of the present invention.

The orthogonal projection of the scan lines 34 on the substrate crosses the orthogonal projection of the data lines 35 and the area where each scan line 34 and each data line 35 crosses at constitutes an intersection area. That is, as shown in FIG. 4, the orthogonal projection of any one of the scan lines 34 on the substrate 1 and the orthogonal projection of any one of the data line 35 on the substrate 1 crosses at an intersection area 36. The intersection area 36 on the scan line 34 is located, in the row direction, between two adjacent first electrode units 23. The intersection area 36 on the data line 35 is located, in the column direction, between two adjacent second electrode units 24.

The scan line 34 between the two rows of the first electrode units 23 could comprise two sub-scan lines 341. The two sub-scan lines 341 and the two rows of the first electrode units 23 are positioned in a one-to-one correspondence. Each sub-scan line 341 extends along a side of its corresponding row of the first electrode units 23. As shown in FIG. 2, each first electrode unit in a row of the first electrode units 23 is in a diamond shape. Thus, the side of the row of the first electrode units 23 facing the sub-scan line 341 is in a wave shape and the corresponding sub-scan line 341 is also in a wave shape in the row direction and positioned in parallel to the side. There is a gap between each sub-scan line 341 and its corresponding row of the first electrode units 23 to make sure that the sub-scan line 341 is insulated from the first electrode units 341. In addition, the two sub-scan lines 341 of one scan line 34 could cross each other at the corresponding intersection area 36.

The data line 35 between the two columns of the second electrode units 24 could comprise two sub-data lines 351. The two sub-data lines 351 and the two columns of the second electrode units 24 are positioned in a one-to-one correspondence. Each sub-data line 351 extends along a side of its corresponding column of the second electrode units 24. As shown in FIG. 3, each second electrode unit 24 in a column of the second electrode units 24 is in a diamond shape. Thus, the side of the column of the second electrode units 24 facing the sub-data line 351 is in a wave shape and the corresponding sub-data line 351 is also in a wave shape in the column direction and positioned in parallel to the side. There is a gap between each sub-data line 351 and its corresponding column of the second electrode units 24 to make sure that the sub-data line 351 is insulated from the second electrode units 351. In addition, the two sub-data lines 351 of one data line 35 could cross each other at the corresponding intersection area 36.

As shown in FIG. 4, the TFT 30 comprises a plurality of TFT structures 37. The gate of the TFT 30 comprises the gates of the TFT structures 37 and the source/drain of the TFT 30 comprises the sources/drains of the TFT structures. The capacitor module comprises a plurality of capacitors and the capacitors and the TFT structures 37 are connected to each other in a one-to-one correspondence such that each TFT structure 37 and its corresponding capacitor could form a sensing unit. Furthermore, the number of the sensing unit is the same as the number of the intersection areas 36. That is, each intersection area 36 has a sensing unit, which means that each intersection area 36 comprises a TFT structure 37. Because one intersection area 36 corresponds to one scan line 4 and one data line 35, the TFT structure 37 in an intersection area 36 is electrically connected to its corresponding scan line 34 and data line 35. The gate of the TFT structure 37 in the intersection area 36 is positioned between two adjacent first electrode units 23 in the column direction. The source/drain of the TFT structure 37 in the intersection area 36 is positioned between two adjacent second electrode units 24 in the row direction.

Because the touch sensor 2 and the optical sensor 3 are both integrated, a parasite capacitor may exist between the electrode of the touch sensor 2 and the electrode of the optical sensor 3. This may influence the operation of the touch sensor 2. That is, the optical sensor 3 may have interference on the touch sensor. Furthermore, conventionally, a Moire pattern may occur when the sensor module is positioned on the display panel. Therefore, the present invention utilizes the structure characteristics of the touch sensor 2 and the optical sensor 3 to design the structures and the sizes of the two sensors. This could improve the signal interference on the touch sensor 2 and the Moire pattern issue.

The TFT structure 37 could comprise a plurality of TFTs. The gate of the TFT structure 37 comprises the gates of the TFTs and the source/drain of the TFT structure 37 comprises the sources/drains of the TFTs. That is, the transmitter electrode 21 of the touch sensor 2 and the gates of the TFTs of the optical sensor 3 are positioned in the same layer. The receiver electrode 22 of the touch sensor 2 and the sources/drains of all the TFTs of the optical sensor 3 are positioned in the same layer.

Figure 6:
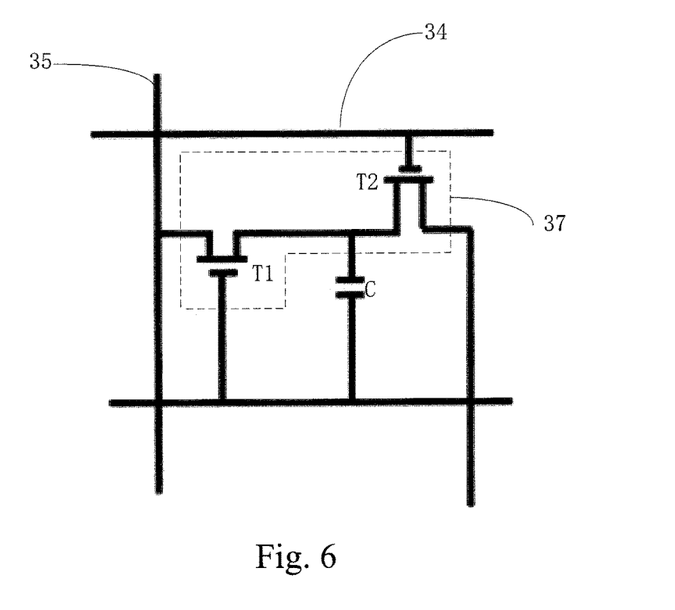
FIG. 6 is a circuit diagram of a sensor unit in the sensor module according to an embodiment of the present invention.

As shown in FIG. 6, in each of the intersection areas 36, the TFT structure 37 comprises two TFTs. The two TFTs comprise a light sensing transistor T1 and a switch transistor T2. The drain D of the light sensing transistor T1 is connected to the corresponding scan line in the intersection area 36. The gate G of the switch transistor T2 is connected to the corresponding scan line 34 in the intersection area 36. The source S of the light sensing transistor T1 is connected to the drain D of the switch transistor T2. One end of the capacitor C is connected to the source S of the light sensing transistor T1 and the other end of the capacitor C is connected to the gate G of the light sensing transistor T1.

The sensor module comprises a passivation layer 5, an insulating layer 6, a black matrix 7, a optical glue 8 and a cover plate 9. The passivation layer 5 covers the gate insulating layer 4, the receiver electrode 22, the source/drain 33 and the active layer 32. The insulating layer 6 is positioned on the passivation layer 5. The black matrix 7 is positioned on the insulating layer 6 and is corresponding to the position of the switch transistor T2 of each TFT structure 37. Thus, the black matrix 7 could cover the light for the switch transistor T2. A conductive layer (not shown) could be placed on the insulating layer 6. The conductive layer could be used to implement the transmitter electrode 21, the receiver electrode 22, and the source/drain 33 of the TFT and thus could be electrically connected to the corresponding external circuits. The optical glue 8 covers the insulating layer 6 and the black matrix 7. The cover 9 is positioned on the optical glue 8.

From the above, an embodiment of the present invention could position the touch sensor and the optical sensor on the substrate. Furthermore, the touch sensor and the optical sensor are placed in the same layer. That is, the receiver electrode of the touch sensor and source/drain of the TFT of the optical sensor are placed in the same layer. This could both integrate the touch sensor and the optical sensor in the display device and realize the short-distance touch control function and the long-distance light sensing function.

Figure 7:
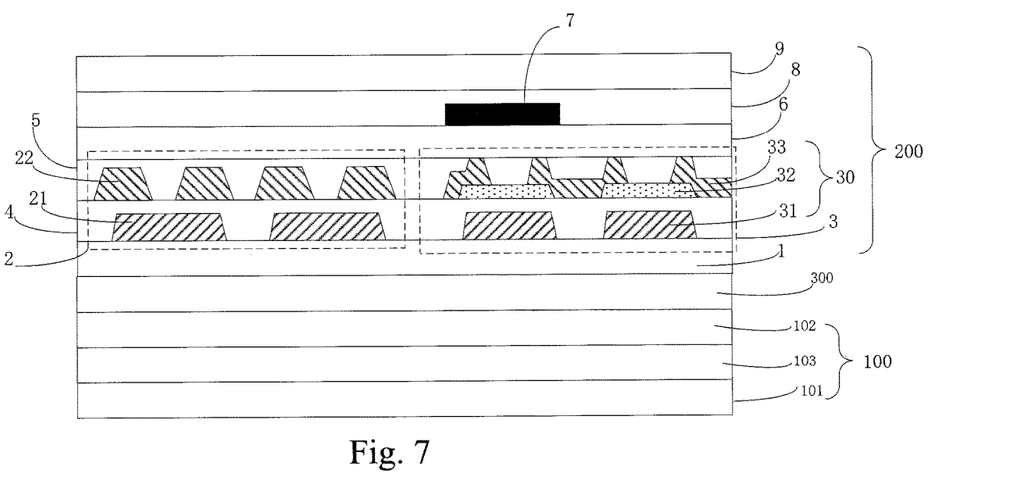
FIG. 7 is a diagram of a display device according to an embodiment of the present invention.

As shown in FIG. 7, a display device is disclosed. The display device comprises a display panel 100 and a sensor module 200 on the display panel 100. The sensor module 200 has been illustrated above and further explanation is omitted here.

The display panel 100 could be an LCD panel. The display panel 100 comprises an array substrate 101, a color film substrate 102 and a liquid crystal layer 103 between the array substrate 101 and the color film substrate 102. When the sensor module 200 is integrated in the display panel 100, the substrate 1 of the sensor module 200 could be pasted on the color film substrate 102 of the display panel through the optical glue 300 to form a display device. The display device could be a color filter on array (COA) structure or a non-COA structure, and its display mode could be a vertical alignment (VA) mode, in-plane switching (IPS) mode, twist nematic (TN) mode, fringe field switching (FFS) mode and/or other modes.

According to an embodiment of the present invention, the touch sensor and the optical sensor could be integrated on the substrate. The transmitter electrode of the touch sensor and the gate of the TFT of the optical sensor are placed in the same layer. The receiver electrode of the touch sensor and the source/drain of the TFT of the optical sensor are placed in the same layer. Thus, the touch sensor and the optical sensor are both integrated and thus the short-distance touch control function and the long-distance light sensing function are realized and thus the composite function of the display device could be achieved.

Above are embodiments of the present invention, which does not limit the scope of the present invention. Any modifications, equivalent replacements or improvements within the spirit and principles of the embodiment described above should be covered by the protected scope of the invention.

What is claimed is:

1. A sensor module, comprising:
   a substrate;
   a touch sensor, positioned on the substrate, the touch sensor comprising:
      a transmitter electrode; and
      a receiver electrode, positioned at one side of the transmitter electrode, which is back on to the substrate; and
   an optical sensor, comprising:
      a thin film transistor (TFT), wherein a gate of the TFT and the transmitter electrode are positioned in a same layer, and a source/drain of the TFT and the receiver electrode are positioned in a same layer; and
   a plurality of scan lines and a plurality of data lines electrically connected to the TFT, wherein the plurality of scan lines and the transmitter electrode are positioned in a same layer and the plurality of data lines and the receiver electrode are positioned in a same layer,
   wherein the transmitter electrode comprises a plurality of rows of first electrode units and any two adjacent first electrode units of the first electrode units along a row direction are electrically connected;

wherein the receiver electrode comprises a plurality of columns of second electrode units and any two adjacent second electrode units of the second electrode units along a column direction are electrically connected;

wherein an orthogonal projection of the plurality of rows of the first electrode units on the substrate crosses an orthogonal projection of the plurality of columns of the second electrode units on the substrate to form a mutual-capacitance electrode structure;

wherein a scan line is positioned between any two adjacent rows of the first electrode units and a data line is positioned between any two adjacent columns of the second electrode units;

wherein each of the scan lines comprises two sub-scan lines corresponding to two rows of the first electrode units adjacent to the scan line, and each of the sub-scan line extends along a side of its corresponding row of the first electrode units; and wherein each of the data lines comprises two sub-data lines corresponding to two columns of the second electrode units adjacent to the data line, and each of the sub-data line extends along a side of its corresponding column of the second electrode units.

2. The sensor module of claim 1, further comprising a plurality of intersection areas;

wherein an orthogonal projection of each of the scan lines on the substrate crosses an orthogonal project of each of the data lines on the substrate at one intersection area of the plurality of intersection areas; and wherein the TFT comprises a plurality of TFT structures corresponding to the plurality of intersection areas.

3. The sensor module of claim 2, wherein the TFT structure in each of plurality of intersection areas comprises a light sensing transistor and a switch transistor;

wherein a drain of the light sensing transistor is electrically connected to a corresponding data line, a gate of the switch transistor is electrically connected to a corresponding scan line, and a source of the light sensing transistor is electrically connected to a drain of the switch transistor.

4. The sensor module of claim 3, further comprising:
a black matrix, positioned at a side of the TFT structures, which is back on to the substrate;
wherein a position of the black matrix is corresponding to a position of the switch transistor of the TFT structures.

5. The sensor module of claim 1, wherein the first electrode units and the second electrode units are all in a grid structure, and the shapes of grids in the grid structure include one or more of triangle, quadrilateral, hexagon, and octagon.

6. The sensor module of claim 5, wherein a dimension of the first electrode units and the second electrode units in a row direction is between 1 mm and 8 mm, and a dimension of the grids in the row direction is between 0.1 mm and 4 mm.

7. A display device, comprising a display panel and a sensor module thereon, the sensor module comprising:
a substrate;
a touch sensor, positioned on the substrate, the touch sensor comprising:
a transmitter electrode; and
a receiver electrode, positioned at one side of the transmitter electrode, which is back on to the substrate; and an optical sensor, comprising:
a thin film transistor (TFT), wherein a gate of the TFT and the transmitter electrode are positioned in a same layer, and a source/drain of the TFT and the receiver electrode are positioned in a same layer; and
a plurality of scan lines and a plurality of data lines electrically connected to the TFT, wherein the plurality of scan lines and the transmitter electrode are positioned in a same layer and the plurality of data lines and the receiver electrode are positioned in a same layer, wherein the transmitter electrode comprises a plurality of rows of first electrode units and any two adjacent first electrode units of the first electrode units along a row direction are electrically connected;

wherein the receiver electrode comprises a plurality of columns of second electrode units and any two adjacent second electrode units of the second electrode units along a column direction are electrically connected;

wherein an orthogonal projection of the plurality of rows of the first electrode units on the substrate crosses an orthogonal projection of the plurality of columns of the second electrode units on the substrate to form a mutual-capacitance electrode structure;

wherein a scan line is positioned between any two adjacent rows of the first electrode units and a data line is positioned between any two adjacent columns of the second electrode units;

wherein each of the scan lines comprises two sub-scan lines corresponding to two rows of the first electrode units adjacent to the scan line, and each of the sub-scan line extends along a side of its corresponding row of the first electrode units; and wherein each of the data lines comprises two sub-data lines corresponding to two columns of the second electrode units adjacent to the data line, and each of the sub-data line extends along a side of its corresponding column of the second electrode units.

8. The display device of claim 7, wherein the sensor module further comprises a plurality of intersection areas;

wherein an orthogonal projection of each of the scan lines on the substrate crosses an orthogonal project of each of the data lines on the substrate at one intersection area of the plurality of intersection areas; and wherein the TFT comprises a plurality of TFT structures corresponding to the plurality of intersection areas.

9. The display device of claim 8, wherein the TFT structure in each of plurality of intersection areas comprises a light sensing transistor and a switch transistor;

wherein a drain of the light sensing transistor is electrically connected to a corresponding data line, a gate of the switch transistor is electrically connected to a corresponding scan line, and a source of the light sensing transistor is electrically connected to a drain of the switch transistor.

10. The display device of claim 9, wherein the sensor module further comprises:
a black matrix, positioned at a side of the TFT structures, which is back on to the substrate;
wherein a position of the black matrix is corresponding to a position of the switch transistor of the TFT structures.

11. The display device of claim 7, wherein the first electrode units and the second electrode units are all in a grid structure, and the shapes of grids in the grid structure include one or more of triangle, quadrilateral, hexagon, and octagon.

12. The display device of claim 11, wherein a dimension of the first electrode units and the second electrode units in a row direction is between 1 mm and 8 mm, and a dimension of the grids in the row direction is between 0.1 mm and 4 mm.

* * * * *